(12) United States Patent
Rebstock (10) Patent No.: US 12,461,453 B2
(45) Date of Patent: Nov. 4, 2025

(54) EUV RETICLE STOCKER AND METHOD OF OPERATING THE SAME

(71) Applicant: BROOKS AUTOMATION (GERMANY) GMBH, SteiBlingen (DE)

(72) Inventor: Lutz Rebstock, Gaienhofen (DE)

(73) Assignee: BROOKS AUTOMATION (GERMANY) GMBH (DE)

( * ) Notice: Subject to any disclaimer, the term of this patent is extended or adjusted under 35 U.S.C. 154(b) by 179 days.

(21) Appl. No.: 18/252,902

(22) PCT Filed: May 10, 2021

(86) PCT No.: PCT/EP2021/062342
§ 371 (c)(1),
(2) Date: May 15, 2023

(87) PCT Pub. No.: WO2022/106071
PCT Pub. Date: May 27, 2022

(65) Prior Publication Data
US 2023/0418169 A1 Dec. 28, 2023

(30) Foreign Application Priority Data
Nov. 18, 2020 (EP) .................................... 20208499

(51) Int. Cl.
*G03F 7/20* (2006.01)
*G03F 1/66* (2012.01)
*G03F 7/00* (2006.01)

(52) U.S. Cl.
CPC ............ *G03F 7/70741* (2013.01); *G03F 1/66* (2013.01); *G03F 7/70933* (2013.01)

(58) Field of Classification Search
CPC .... G03F 7/70741; G03F 1/66; G03F 7/70933; G03F 7/70983; H01L 21/67359
See application file for complete search history.

(56) References Cited

U.S. PATENT DOCUMENTS

| 6,994,507 | B2* | 2/2006 | Matsumoto ......... G03F 7/70933 414/217 |
| 10,354,897 | B2 | 7/2019 | Abe et al. |
| 11,430,682 | B2 | 8/2022 | Pan et al. |
| 11,594,437 | B2 | 2/2023 | Raschke et al. |

(Continued)

FOREIGN PATENT DOCUMENTS

| CN | 102789132 | 11/2012 |
| CN | 111830781 | 10/2020 |

(Continued)

OTHER PUBLICATIONS

International Search Report for application PCT/EP2021/062342 dated Aug. 25, 2021.

(Continued)

*Primary Examiner* — Mesfin T Asfaw
(74) *Attorney, Agent, or Firm* — Perman & Green, LLP (57) ABSTRACT

A one-piece clamping device, a storage system and an operating method for an EUV reticle stocker are provided. The required space for storing EUV reticles is significantly reduced while ensuring a high quality storage environment for the stored EUV reticles. A further aspect provides a stocker for storing EUV reticles.

21 Claims, 9 Drawing Sheets

(56) References Cited

U.S. PATENT DOCUMENTS

| | | | |
|---|---|---|---|
| 2003/0136512 A1* | 7/2003 | Yamamoto | G03F 9/7096 |
| | | | 430/5 |
| 2009/0301917 A1 | 12/2009 | Kolbow et al. | |
| 2010/0025277 A1 | 2/2010 | Iwaki et al. | |
| 2013/0100430 A1 | 4/2013 | Lansbergen et al. | |
| 2017/0052460 A1 | 2/2017 | Yoneda et al. | |
| 2019/0131147 A1* | 5/2019 | Lee | H01L 21/67383 |
| 2019/0155139 A1* | 5/2019 | Chang | G03F 7/2002 |
| 2019/0214287 A1 | 7/2019 | Chiu et al. | |
| 2020/0211876 A1 | 7/2020 | Raschke et al. | |

FOREIGN PATENT DOCUMENTS

| | | |
|---|---|---|
| JP | H10163094 | 6/1998 |
| JP | 2011124591 | 6/2011 |

OTHER PUBLICATIONS

Brux O et al: "Investigating the intrinsic cleanliness of automated handling designed for EUV mask pod-in-pod systems", Photomask Technology 2011, SPIE, 1000 20th St. Bellingham WA 98225-6705 USA, vol. 8166, No. 1, Nov. 3, 2011 (Nov. 3, 2011), pp. 1-9, XP060021588, D0I: 10.1117/12.896908 [retrieved on Jan. 1, 1901].

\* cited by examiner

EUV RETICLE STOCKER AND METHOD OF OPERATING THE SAME

CROSS-REFERENCE TO RELATED APPLICATIONS

This application is a National Stage of International Application No. PCT/EP2021/062342 having an International Filing Date of 10 May 2021, which designated the United States of America, and which International Application was published under PCT Article 21(2) as WO Publication No. 2022/106071 A1, which claims priority from and the benefit of European Patent Application No. 20208499.2, filed on 18 Nov. 2020, the disclosures of which are incorporated herein by reference in their entireties.

BACKGROUND

Field

The present disclosure relates to a stocker for EUV reticles and a method of operating said reticle stocker.

Photolithography processes are widely used as one of the key steps in the manufacture of integrated circuits (ICs) and other semiconductor-related devices and/or structures. However, as the dimensions of features produced by such processes decrease, the importance of photolithography for the production of miniature ICs or other devices and/or structures rises.

Brief Description of Related Developments

In photolithography, a geometric pattern is transferred from a photomask (typically referred to as reticle) onto a substrate, for example a semiconductor wafer, by the use of light, a photosensitive layer and a subsequent etching step. Depending on the desired feature size on the substrate, the feature size of the reticle needs to be adapted as well as the wavelength of the light used for pattern transfer, with consideration of the Rayleigh criterion.

In order to reduce the smallest achievable feature size, it has been proposed to use extreme ultraviolet (EUV) radiation. EUV radiation is electromagnetic radiation having a wavelength within the range of 5-20 nm, for example within the range of 5-10 nm.

Any contamination of the reticle may reduce the imaging performance of the photolithographic process and may in more serious cases require the reticle to be replaced. The reticle is typically expensive and therefore any reduction in the frequency with which it must be replaced is advantageous. Furthermore, replacement of the reticle is a time consuming process, during which the photolithographic process may have to be supported, thereby reducing its efficiency, which is undesirable.

For EUV applications, particle contamination with particle sizes of less than 10 nm as well as chemical contamination, for example by adsorption of volatile organic compounds, can be relevant.

The reticles used for such EUV applications are therefore typically stored in a storage stocker, and retrieved when needed in connection with the lithography exposure equipment. Usually, the reticles are contained in a double shell container (double pod) comprising a so-called EUV outer pod (EOP) and an EUV inner pod (EIP).

Such a double pod is described in further detail in US 2019/0214287 A1, for example.

Since the acceptable level of particle contamination is extremely small, friction (which leads to abrasion and thus particle generation) of the reticle against the container as well as friction of container components relative to one another needs to be avoided. Therefore, typical EIPs are designed so as to accommodate one reticle in such a way that it has only very limited possibilities to move therein. They are also equipped with additional reticle immobilization means to immobilize the reticle inside the EIP. In order to prevent contamination, the EIP is designed to enable a protective gas or vacuum to be applied to the reticle. To that end, typically orifices equipped with filter material are provided for the protective gas to enter from the EOP into the surroundings of the reticle contained in the respective EIP.

The EOP is equipped with actuation means adapted to bias the reticle immobilization means of the EIP into a retaining position, thereby immobilizing the reticle inside the EIP when the EOP is attached to the EIP. The EOP also functions to immobilize the typically two pieces of the EIP against one another to prevent friction induced abrasion.

SUMMARY

It is to be understood that the EIP components are moveable against one another as long as they are not immobilized from outside. In order to avoid friction induced abrasion caused by such movement, the EOP conventionally provides such immobilization functionality for the EIP while also providing protection against the surrounding atmosphere, which is necessary e.g. during transport between a storing position and process tools requiring reticles for operation.

EOPs are rather bulky, leading to high space requirements or "footprint" for stockers storing EUV reticles. Furthermore, they are made of polymeric material, which is also prone to abrasion and outgas sing of volatile organic compounds.

The present disclosure solves these problems by providing methods, devices and systems with features according to the independent claims. Advantageous aspects and additional features are provided in the dependent claims and discussed in the following description.

The present disclosure enables reducing the required space for storing reticles while ensuring at least the same level of contamination and damage protection provided by conventional systems. Chemical contamination during storage from outgassing EOPs is prevented and mechanical damage protection improved over storing reticles in double pods. For example, EOPs can easily be damaged during an earthquake, while devices according to the present disclosure are less fragile, even under such challenging conditions, as will be understood from the following description.

Aspects which need to be taken into account when developing such an improved storage concept include that it is highly undesirable to change the way the reticles are provided to the photolithographic process equipment, this typically being the most complicated and costly part of a semiconductor production facility.

Therefore, since the photolithographic process equipment is typically adapted to receive double pods, means for providing a conventional double pod to the photolithographic process equipment are advantageously provided with the improved reticle stocker.

Be it noted that all the method steps discussed herein below can advantageously be carried out in an automated manner, for example by a robotic component.

In one aspect of the disclosure, a clamping device for an EUV inner pod (EIP) is provided, the EIP comprising two or more components and containing or adapted and configured to contain an EUV reticle, wherein the clamping device comprises a one-piece clamping element configured to provide the functions of immobilizing the two or more components of the EIP relative to one another and immobilizing the reticle therein, and to only partially cover the EIP. For example, only a fraction amounting to less than 90%, 80%, 75%, 50%, 25%, 20% or 10% of an outer surface of the EIP is covered by the clamping device according to the disclosure. The clamping device, therefore, allows e.g. the atmosphere surrounding the clamping device to come into contact with the EIP, thus e.g. obviating the need for sophisticated supply means for protective gasses.

The clamping device according to the disclosure comprises a one-piece clamping element, configured to act upon all of the at least two EIP components to provide said immobilizing functionalities. In other words, the one-piece clamping element spans across at least one of the components and wraps around at least one side thereof so as to also reach the at least one more EIP component.

Be it noted that the clamping device can also be used for clamping the components of the EIP together, even if this does not hold a reticle. In this case, only the components of the EIP are immobilized relative to one another.

Advantageously, the clamping device is further configured to act upon one or more retainers of the EIP, the retainer(s) being configured to immobilize the reticle therein, when acted upon from outside the EIP, to immobilize the reticle within the EIP. Therefore, the immobilization of the reticle within the EIP is effected through the clamping device acting upon the retainer(s) provided with the EIP. This provides the advantage, that existing systems can continue to be used without the need for retrofitting, thus avoiding costly investments.

Advantageously, the clamping element is mainly made of metallic materials, the metallic materials comprising preferably at least 75%, 80%, 90%, 95% or 99%, with respect to total device volume and/or mass. This mitigates the above mentioned problem of chemical contamination through outgassing of polymeric materials. Thereby, the required amount of purging gases and the frequency of necessary reticle replacement can be reduced. Other possible materials with similar advantages are, for example, polycarbonates (PC), poly ethyl ether ketones (PEEK) or cyclo olefin (co)polymers (COC/COP). The uniting feature of these materials is a particularly low outgassing characteristic.

Advantageously, the one-piece clamping element is configured to act upon the retainer(s) of the EIP to immobilize the reticle therein. It can thus replace or emulate the immobilization function that the EOP traditionally fulfils without the drawbacks in terms of chemical contamination and spatial footprint.

In preferred aspects, the clamping device comprises an upper portion and at least one U-shaped profile integrally formed at an edge of the upper portion and biased towards a closed position and configured to be elastically bent into an open position. The clamping device in this aspect is configured to be attachable to an EIP, when the U-shaped profile is in the open position and to immobilize the EIP components and the reticle relative to one another, when the U-shaped profile is in the closed position. This provides a substantially frictionless yet stable clamping device which is relatively easy to produce.

Advantageously, the clamping device in such a case comprises two U-shaped profiles, arranged on opposite edges of the upper portion, thereby further improving stability and facilitating design and handling.

Advantageously, the clamping device comprises actuators configured to act upon the retainer(s), when the clamping device is attached to the EIP.

Advantageously, the clamping device has an envelope volume of less than 130%, 120%, 110%, 105% or even less than 100% of an envelope volume of an EIP to which the clamping device is attachable. This substantially reduces the spatial footprint of storing a reticle compared to storage within a double pod comprising an EIP and an EOP. This may also reduce the required amount of purging gases, as mentioned above. An envelope volume, for example, can be understood as describing the volume of the smallest possible cuboid completely containing a respective object. Therefore, for example in cases where the clamping device is designed flatter and/or shorter than an EIP, it may have an envelope volume that is smaller than the one of the EIP.

The clamping device according to some aspects may be equipped with an information carrying element, such as an RFID device or a visually detectable code such as a bar code, a QR code or other forms of 1D or 2D codes. This provides the advantage that information about the reticle can be associated with the corresponding clamping device. Therefore, it may be possible, for example, to identify a stored reticle solely by identifying the clamping device associated with it.

Furthermore, such information can be used for tracking purposes, for example to count the number of storage operations performed with a given clamping device. This is useful in order to determine the appropriate time for cleaning or replacement procedures or functionality tests.

In some aspects, a sensor for monitoring certain conditions during storage and handling, such as humidity, temperature, pressure, acceleration or the concentration of certain chemical species in the storage atmosphere and the like is included in the clamping device. This provides the advantage of knowledge of influencing factors experienced by reticles throughout their storage history and can therefore improve the overall productivity of a production facility in which the present disclosure is used.

Such information can be stored and processed in a memory and/or processor provided with the clamping device or in a component of a machine or tool handling a storage system according to the disclosure.

In another aspect, the present disclosure provides a storage system comprising a clamping device as described above and an EIP. The EIP comprises two or more components, is configured to accommodate an EUV reticle and comprises one or more retainers configured to immobilize a reticle contained within the EIP when the retainer(s) is/are acted upon from outside the EIP. The clamping device is attached to the EIP to immobilize the two or more components of the EIP relative to one another and acts upon the retainer(s), thus immobilizing the reticle within the EIP. Therefore, abrasion can be substantially avoided and contamination of the reticle by particles in a relevant size range minimized.

Typically, the retainer(s) is/are provided in the form of one or more pistons penetrating one of the EIP components. Each of the pistons is elastically biased into a retracted position and is adapted to apply a normal force onto the reticle when acted upon from outside the EIP. At the same time, the retainer(s) is/are in sealing engagement with the EIP component it penetrates in order to protect the reticle stored within the EIP from contamination with contaminants from outside the EIP.

In a preferred aspect, the storage system has an envelope volume of less than that of an EOP, for example, the envelope volume of the storage system is less than 130%, 120%, 110% or 105%, compared to the envelope volume of the EIP. As such, the space required for storing a reticle is significantly reduced as compared to conventional storage systems in the form of a double pod comprising an EIP and an EOP.

Another aspect of the disclosure provides a method of operating an EUV reticle stocker, comprising storing reticles in the reticle stocker and retrieving reticles from the reticle stocker, wherein the reticle is contained within an EIP comprising two or more components, the storing comprises moving the EIP containing a reticle to a storage position within the EUV reticle stocker; and the retrieving comprises removing an EIP containing a reticle from its storage position and wherein the EIP components and the reticle are immobilized relative to one another when moved to or from the storage position and when in the storage position, particularly by a clamping device not covering the EIP completely, e.g. a clamping device as described above. The method according to the disclosure further comprises supplying a purge gas to each storage position containing an EIP. This reduces the required space for storing reticles in comparison to conventional storage methods.

Particularly, the storing, before the step of moving to a storage position, further comprises the steps of: receiving, from outside the stocker, a double pod comprising an EUV outer pod (EOP) and an EIP containing an EUV reticle, wherein the EIP is entirely contained within the EOP; opening the EOP; and attaching a clamping device to the EIP to immobilize EIP components relative to one another and to act upon the retainer(s) provided in the EIP to immobilize the reticle relative to the EIP to provide the storage system. Particularly, attaching the clamping device to the EIP comprises bringing the clamping device, particularly the U-shaped profile thereof, into the open position, placing the opened clamping device over the EIP and releasing the clamping device into the closed position. In such aspects, the storage system is provided by the improved stocker itself, making it possible to directly utilise the stocker in conjunction with an existing manufacturing process without substantially altering any process steps carried out outside the stocker. Particularly, the stocker in such aspects comprises an assembler or applicator which is configured to perform the opening, attaching and releasing operation to provide the storage system.

In a preferred aspect, receiving a double pod comprises accepting the double pod at an outwardly facing side of an entrance terminal comprising an airlock, opening a first shutter of the airlock, moving the double pod into the airlock, closing the first shutter, decontaminating an inner volume of the airlock, opening a second shutter of the airlock, moving the double pod through the second shutter to an inwardly facing side of the entrance terminal, and closing the second shutter. In other words, the double pod it is passed through the airlock from an outwardly facing side to an inwardly facing side of the entrance terminal, including a decontamination of the inner volume of the airlock, while the double pod is inside the airlock. This provides the advantage of avoiding contamination of the stocker.

Opening of an EOP may include unlocking the EOP, removing it from around the EIP and storing it in an EOP buffer stock. The EOP buffer stock may be an integral component of the reticle stocker and is preferably separated from the storage positions for the storage system described above, in order to prevent cross contamination from the outer side of the EOP to the EIP. In some aspects, the EOP buffer stock may also be arranged spaced and/or separated from the reticle stocker, thus not forming a component of the reticle stocker as such. Thus, strict cleanliness requirements can be met while reducing the space needed for storing reticles. For the same reason, it may be beneficial for the clamping device to remain within the stocker at all times or at least during extended times of operation of the stocker. Particularly, the clamping device is typically not intended to leave the stocker when attached to an EIP.

The retrieving of reticles after the step of removing the storage system from its storage position preferably further comprises detaching the clamping device from the EIP, particularly by bringing the U-shaped profile of the clamping device into the open position and distancing the so opened clamping device from the EIP, assembling an EOP around the EIP to immobilize the EIP components and the reticle contained within the EIP relative to each other, forming a double pod, and delivering the double pod to outside the stocker, preferably by passing it through an airlock in order to prevent contamination of the stocker atmosphere. This provides the advantage that standard double pods can be used with the production process in the facility, thereby enabling conventional process equipment to profit from the improved storage conditions provided in connection with this disclosure.

The EOP used for this assembling can preferably be retrieved from the above mentioned EOP buffer stock. This provides the advantage that an EOP is not required for every reticle to be stored, while ensuring timely supply of any reticles required for the manufacturing process. In other words, the number of reticles stored can significantly exceed the number of EOPs provided. In other words, only those reticles required outside the stocker at any given time require an EOP during that time.

Preferably, it is ensured, during any step performed at a time when the reticle is not immobilized relative to the EIP, that the reticle and/or EIP components are not moved relative to one another, in order to prevent abrasion and corresponding particle generation.

In cases in which the clamping device is provided with an information carrying element, as described above, the method can advantageously comprise one or more steps in which information carried by the clamping device is read, written, deleted or altered. In such steps information about the identity of a reticle associated with a handled clamping device, the storage conditions a reticle experienced or other pieces of information can be used for controlling the reticle stocker or other tools, machines or devices in order to provide improved overall performance of the production facility.

The method may further comprise reading, receiving or otherwise collecting information provided by the one or more sensors optionally provided with the clamping device in order to monitor a history of storage conditions that the reticle has experienced. This provides the advantage that those reticles which are more likely to have deficiencies regarding quality can, for example, be inspected prior to use in the manufacturing of semiconductor products to ensure their integrity. Thereby, the output of faulty products is minimized.

In a further aspect of the disclosure, a stocker for storing at least one EUV reticle is provided, wherein each of the at least one reticle is stored or adapted and configured to be stored in one respective EUV inner pod (EIP), wherein the EIP comprises two or more EIP components which are immobilized relative to one another by a clamping device as described above, wherein the EIP comprises one or more retainers configured to immobilize the reticle stored inside the EIP relative to the EIP, when acted upon from outside the EIP, wherein the clamping device acts upon the retainer(s) to immobilize the reticle stored within the EIP, the stocker comprising: a loading port (also referred to as entrance terminal in the language of this disclosure) comprising an airlock and an assembler; a storage unit configured to store EIPs each immobilized by one clamping device and each containing one reticle; and a handler configured to move the clamped EIP containing the reticle to and from a storage position within the stocker; wherein the airlock is configured to receive a double pod comprising an EUV outer pod (EOP) and an EIP containing a reticle from outside the stocker, wherein the EOP acts upon the retainer(s); and the assembler is configured to open the EOP without causing movement of EIP components and the reticle relative to one another; to attach said clamping device to and remove the clamping device from said EIP without causing movement of the EIP components and the reticle relative to one another; and to assemble an EOP around the unclamped EIP.

The stocker, according to the disclosure, is adapted to provide a stream of purge gas to the storage positions or compartments in which clamped EIPs are stored. In all the aspects of the present disclosure, it is particularly beneficial, that the EIPs are stored without corresponding EOP surrounding or enclosing them. In the prior art, EIPs stored in EOPs are also purged with a purge gas, which is provided to the inside of the EOP via one or two small orifices. In the present disclosure, there is no need for a sophisticated supply mechanism to such orifices, since the EOP is not stored together with the EIP. The provision of a purge gas stream according to the disclosure, therefore, may be effected at a much smaller flow rate, particularly around 0.2 to 1.0 L/min/storage position with the same or better effect on storage atmosphere as the typically used flow of about 2.5 L/min/EOP. This results in a much more uniform purge flow and therefore in a cleaner storage environment while drastically reducing operating costs. In other advantageous aspects, a purge flow rate of between 1 and 20 L/min/storage position, particularly between 2 and 10 L/min/storage position, may be provided in order to provide for an overall improved purity or cleanliness level. The choice of purge flow rates, therefore, depends on the concrete aims and may be set according to user preferences without being particularly limited in any direction. The purge gas may, for example, be supplied to the storage positions via a diffuser plate with a multitude of openings through which the purge gas can access each storage position or compartment, thereby forming a uniform gas stream through the individual storage positions or compartments. Particularly, the storage positions are isolated against one another such that purge gas cannot pass from one storage position to another and cross contamination from one EIP to another is avoided. One advantage provided by the disclosure is an overall lower flow resistance as compared to conventional storage systems such as double pods, which grant access for purging fluids through dedicated purge orifices. Since the purge orifices are comparatively small, a high flow resistance due to fluid friction may result during any purging operation. With the disclosure, providing access for purge fluids with a wide cross section (substantially open storage systems), such a flow resistance is much smaller, therefore necessitating lower energy input for providing the purge fluid to the respective EIPs in the desired quantities or flow rates.

Advantageously, the stocker further comprises an EOP buffer stock, configured to store a number of EOPs in a controlled atmosphere with a robotic EOP-handler configured to place an EOP into and retrieve an EOP from the EOP buffer stock.

In some aspects, the EOP buffer stock may also be provided separately and/or spaced from the reticle stocker, such that a stocker system comprising the described reticle stocker and a dedicated EOP buffer stock may be provided. This helps control the contamination inside the reticle stocker to a very low level.

In other words, the stocker is adapted to implement the above described method(s) and therefore profits from the same advantages as the method described above.

BRIEF DESCRIPTION OF THE DRAWINGS

Advantages and further aspects of the disclosure will now be discussed in further detail with reference to the accompanying drawings, wherein.

DETAILED DESCRIPTION

Figure 1:
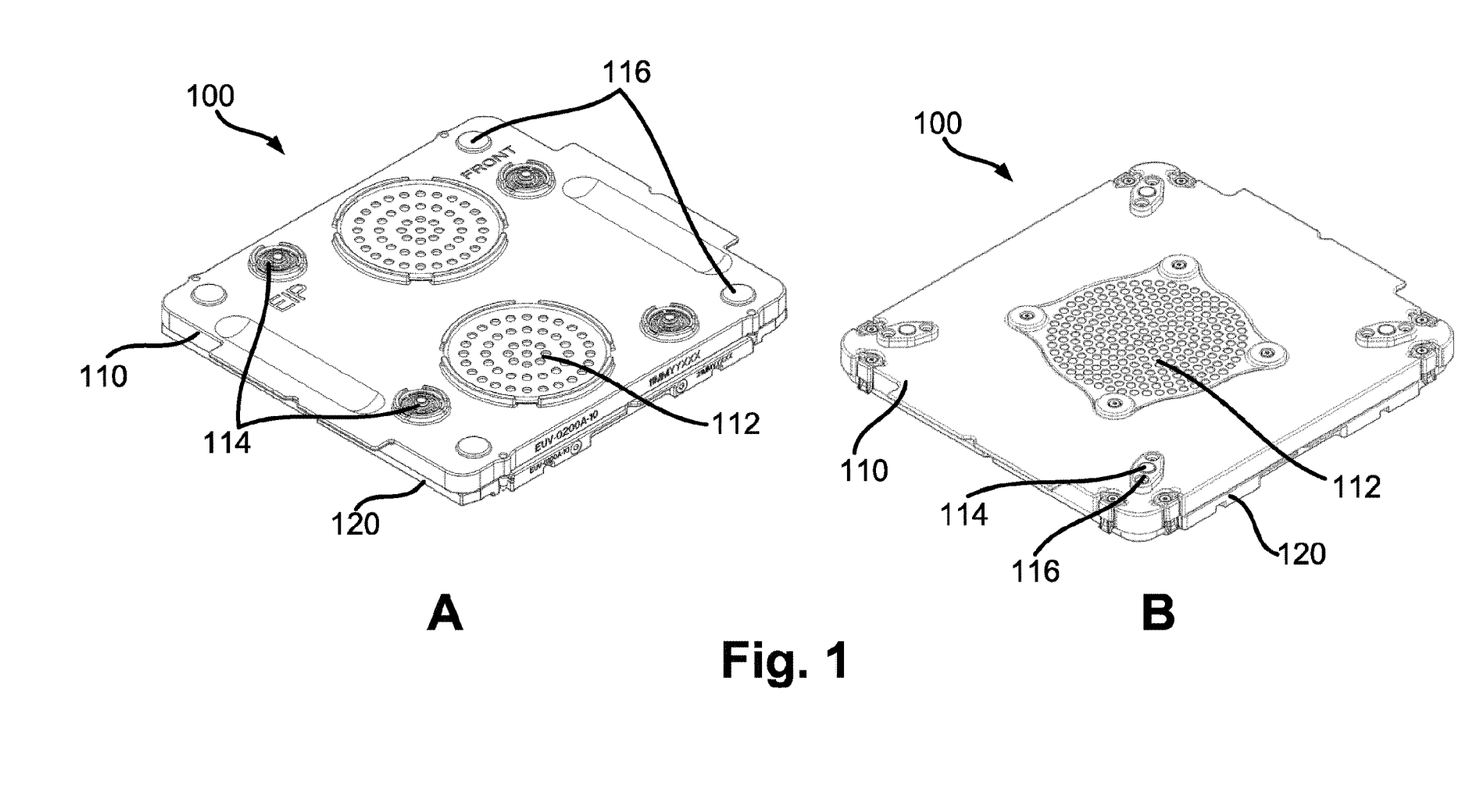
FIG. 1 shows two different aspects of an EIP, in connection with which the present disclosure can be implemented.

Two aspects A, B of a conventional EIP generally designated 100 are shown in FIG. 1. Each EIP 100 comprises an upper component 110 and a lower component 120. The upper component 110 comprises one or more orifices 112, retainers 114 and pressure points 116.

The retainers 114 are provided in the form of four pistons, biased into a retracted position by elastic elements and connected to the upper component 110 in a sealing manner by an elastic seal to prevent particulate contaminants from entering the inside of the EIP.

The orifices 112 are equipped with filter material also preventing particulate contaminants from entering the inside of the EIP while providing access for purging and/or protective gas(es) such as nitrogen.

The pressure points 116 are provided for immobilizing the two components 110, 120 relative to one another and the retainers are provided for immobilizing a reticle inside the EIP when acted upon from outside the EIP.

Pressure points similar to the pressure points 116 of the upper component 110 may also be provided with the lower component 120.

In aspect A of EIP 100, the pressure points 116 are spatially separated from the retainer 114, while in aspect B, the retainers 114 are provided within the same area as the pressure points 116 and extend through the pressure points 116.

Figure 2:
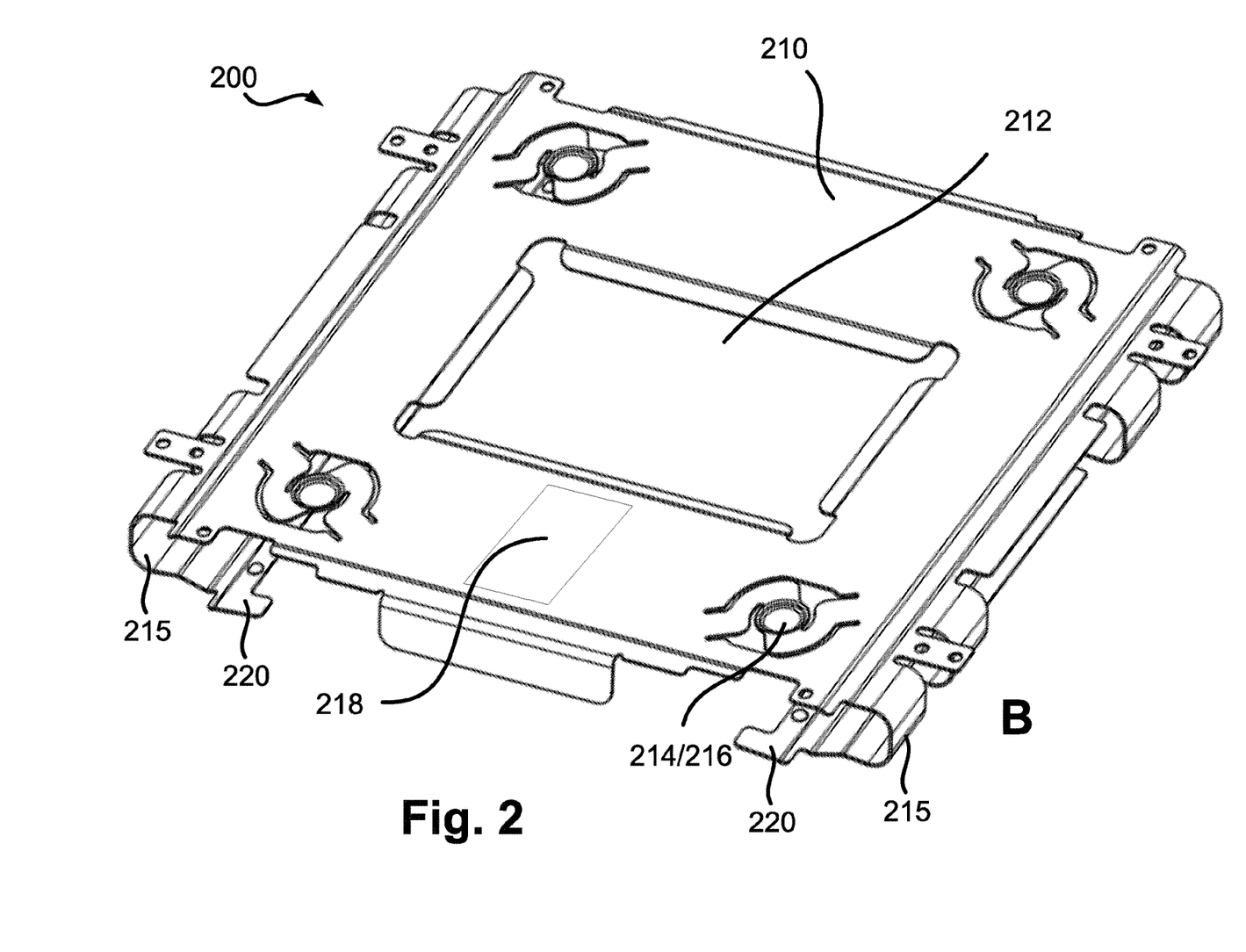
FIG. 2 schematically shows a perspective view of an advantageous aspect of a clamping device according to the disclosure.
Figure 2A:
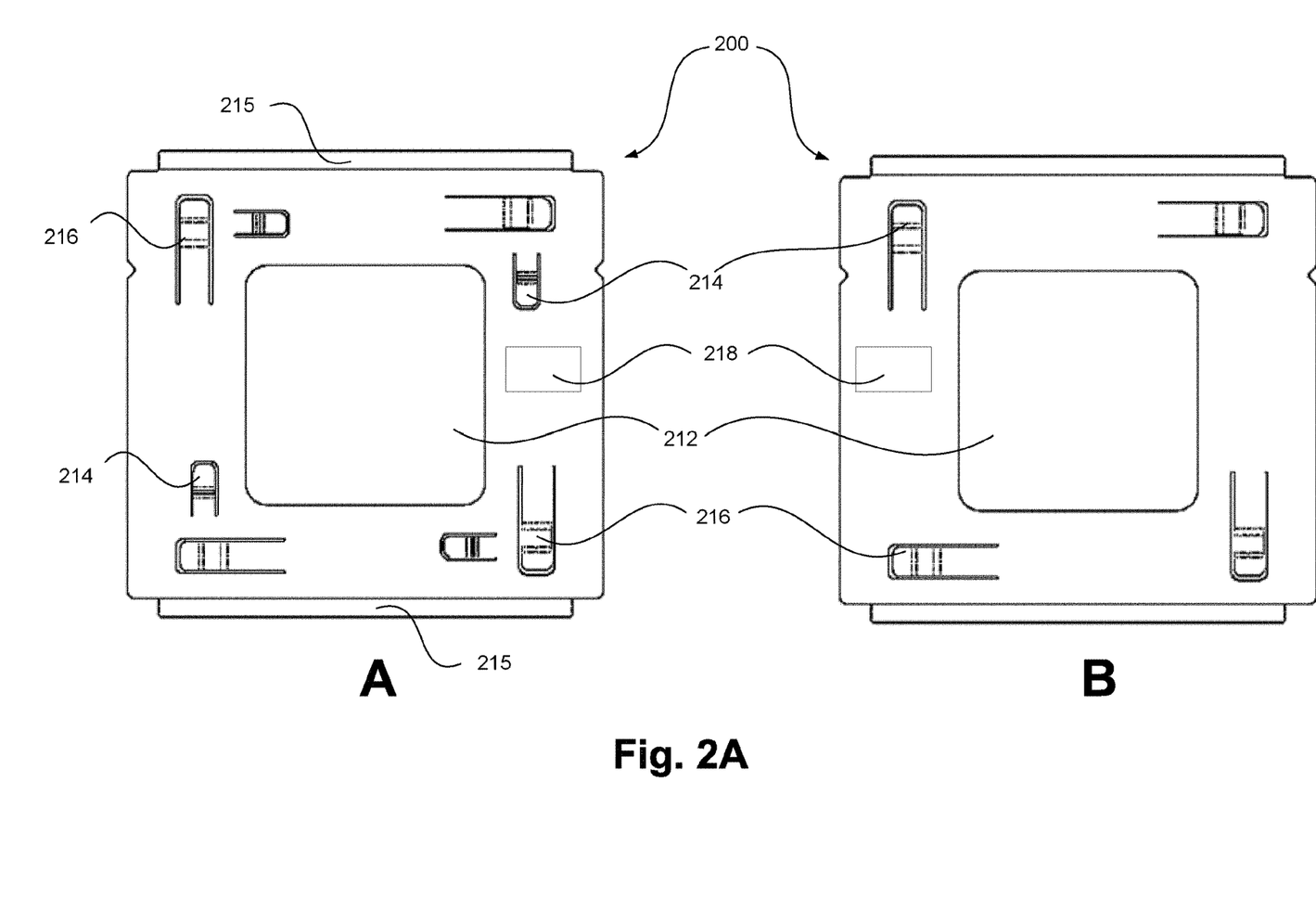
FIGS. 2A and 2B schematically show advantageous aspects of a clamping device according to the disclosure.
Figure 2B:
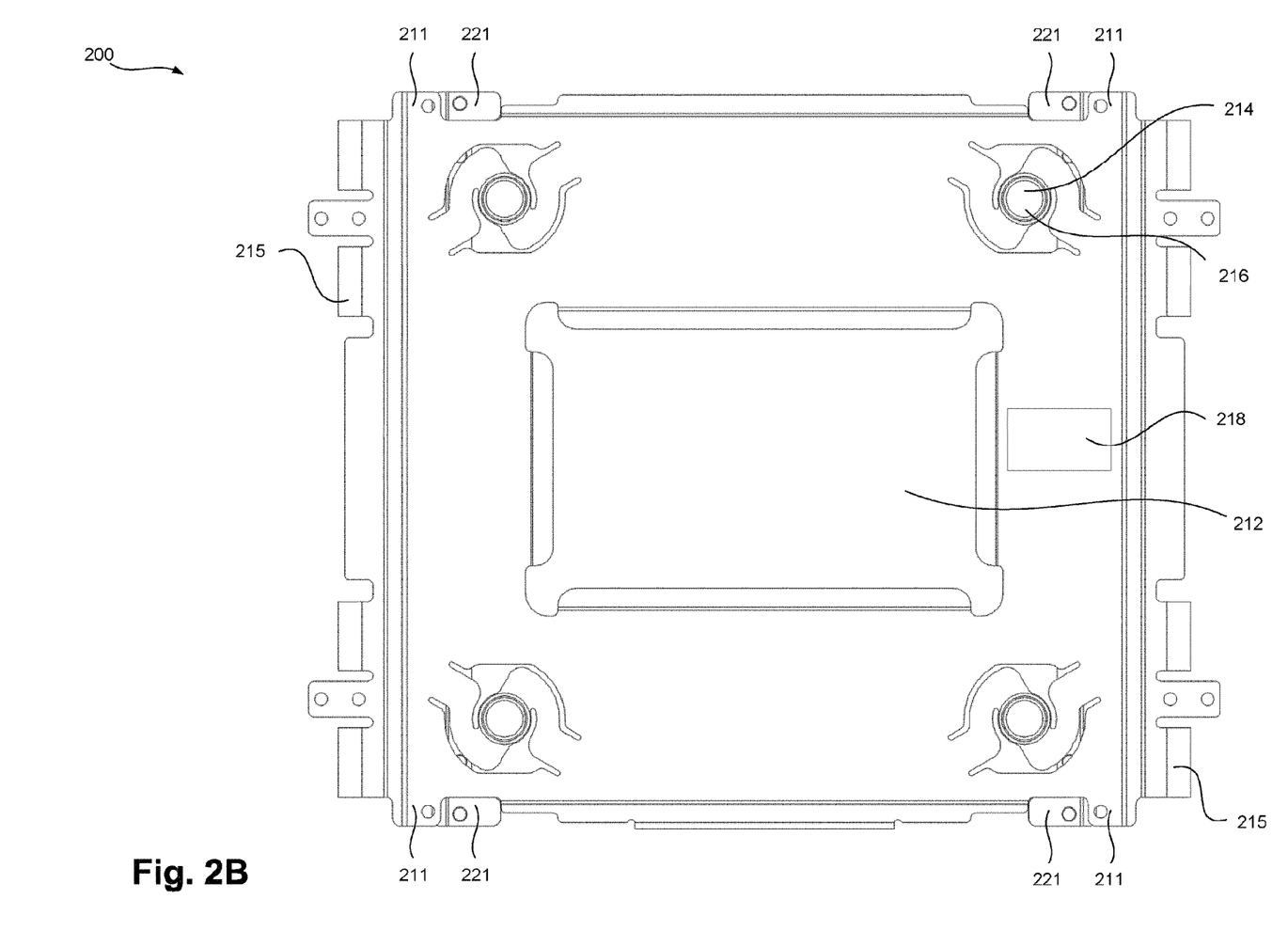

In FIGS. 2, 2A and 2B clamping devices 200 usable in connection with aspects A, B of EIP 100 are schematically depicted.

The clamping device 200 comprises a one-piece clamping element made of metal (e.g., sheet metal) with an upper portion 210, and two U-shaped profiles 215 integrally formed at opposite edges of the upper portion 210. A lower portion 220 is formed by respective lower sections of the U-shaped profiles 215. The upper portion 210 features an orifice 212 substantially corresponding to the one or more orifices 112 of the EIP in terms of location and is formed to fit onto EIP 100. The part of the surface of EIP 100, which corresponds to the orifice 212 in terms of location, is referred to as "not covered" in the language of this disclosure, while particularly portions of the surface of EIP 100, which are in contact with or located directly opposite or under a material surface of the clamping device 200, are considered to be "covered". Therefore, according to the disclosure, clamping device 200 is configured to only partially cover EIP 100. The orifice 212 can especially take up more than 10%, 20%, 25%, 50%, 75%, 80% or 90% of the surface area of the upper portion 210. Furthermore, a similar orifice may also be provided in the lower portion 220 (not shown in the figures). In the example shown in FIG. 2, however, the lower portion 220 is formed of two separate edges, each forming part of one of the two U-shaped profiles 215. Therefore, the lower portion 220 only covers portions of the lower EIP component 120 which are close to the edge. Additionally, a sideways facing surface of EIP 100, which is in correspondence with neither of the upper 210 or lower 220 portions nor the U-shaped profiles 215 is also considered "not covered".

The lower portion 220 of the one-piece clamping element 200 may be essentially flat and may comprise two spatially separated portions, each being a lower section of one of the U-shaped profiles 215.

The upper 210 and lower 220 portions of the one-piece clamping device 200 are therefore integrally formed and are configured to accommodate and immobilize the EIP 100 between them. To that end, the upper and lower clamping elements are both equipped with pressure applicators 216, which are configured to press against the respective pressure points 116 of the upper and lower components 110, 120 of the EIP 100 to immobilize the EIP components 110, 120 relative to one another.

The clamping device 200 is configured such that the lower portion 220 is elastically retractable or bendable with respect to the upper portion 210, such that the immobilization of an EIP accommodated between the upper and the lower portions 210, 220 may be effected or revoked, as desired, by elastically bending the lower portion 220 away from the upper portion 210, thereby widening the U-shaped profiles 215. In the shown example, the lower portion 220 is provided in the form of two separate latches (two lower sections of the respective two U-shaped profiles 215). However, also aspects of the clamping device 200 in which the lower portion 220 is provided substantially symmetrically to the upper portion are conceivable and may provide some benefits, particularly in terms of stability.

Figure 3:
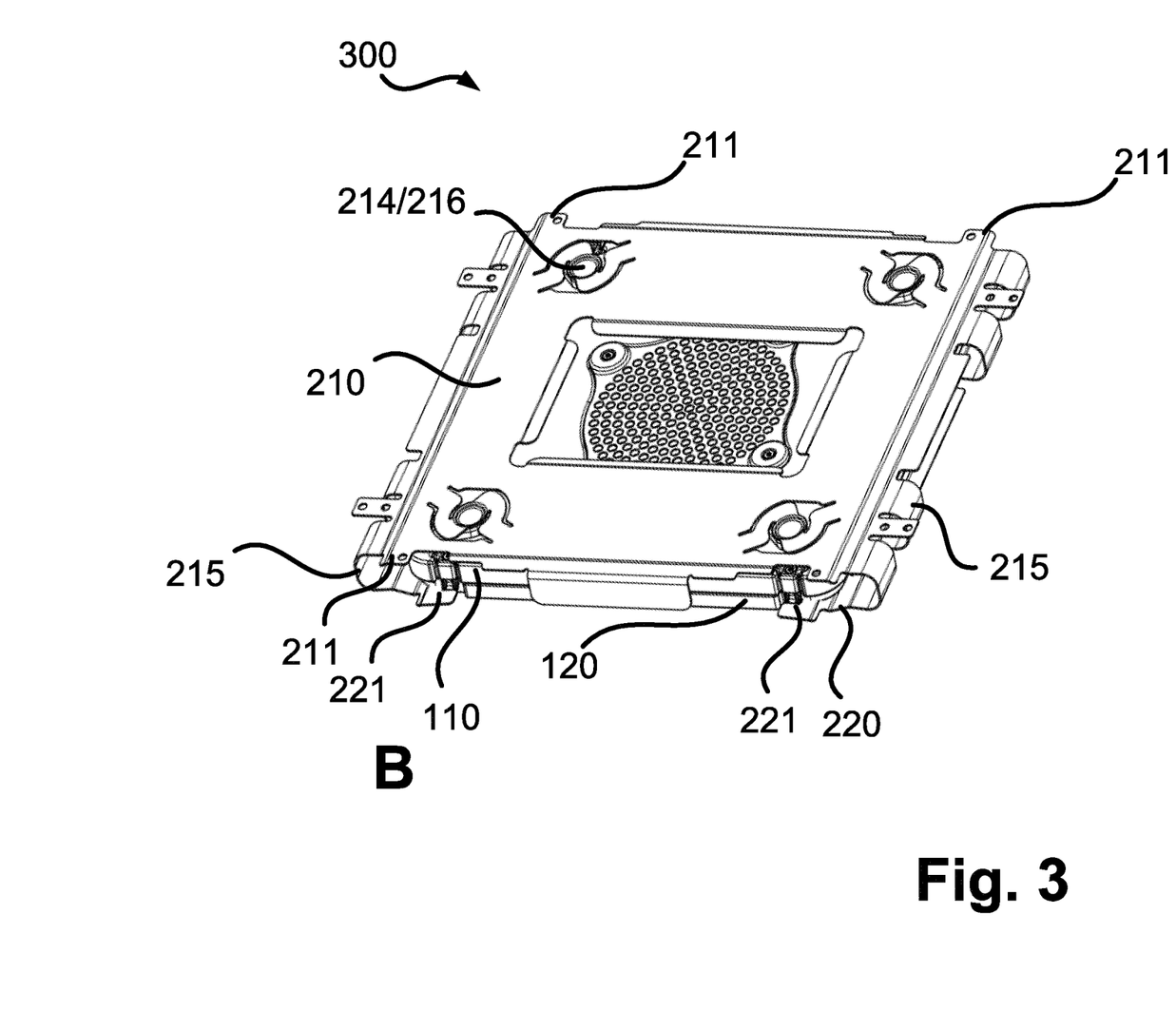
FIG. 3 shows a schematic representation of a preferred aspect of a storage system comprising a one-piece clamping device according to the disclosure in perspective view.

Be it noted, that, as shown in FIGS. 2 and 3, the U-shaped profiles 215 may be interrupted across the length of the edge of the upper portion 210 of the clamping device 200 it is provided at. In other words, holes or slits may be provided within the U-shaped profiles 215, particularly in order to adjust contact forces to a desired value and/or to facilitate fluid access to the sides of the EIP 100, otherwise covered by the U-shaped profile 215.

Further, actuators 214 are provided with the upper portion 210 for aspect A of EIP 100 which are configured to act upon the retainers 114 of the upper component 110 of aspect A of EIP 100, when the clamping device 200 is attached to EIP 100.

In the clamping device 200 adapted for use with aspect B of EIP 100, pressure applicators 216 simultaneously fulfil the function of actuators 214. Thus, each pressure applicator 216 also constitutes an actuator 214.

For both aspects shown, by acting upon the retainers 114 of EIP 100, the clamping device 200 immobilizes the reticle contained within EIP 100 relative to the EIP 100.

The pressure applicators 216 and the actuators 214 may be provided in the form of tongue shaped cut-outs or flat or ortho-planar springs, for example, and can be configured to apply predetermined forces to the pressure points 116 and the retainers 114, respectively.

Advantageously the pressure applicators 216 are configured to apply a predetermined force to each of the pressure points 116. In the clamping device for use with aspect A of EIP 100, this force applied to the pressure points may be different from the predetermined force the actuators 214 apply to the retainers 114. As such, the forces applied to the retainers 114 and the pressure points 116 can be adapted to the required forces needed for immobilizing the respective parts relative to one another. Typically, the forces required for immobilizing the reticle within the EIP are smaller than the forces required for immobilizing the upper component 110 relative to the lower component 120. Therefore, a cut-out forming an actuator 214 may be longer and/or narrower than a cut-out forming a pressure applicator 216.

In the clamping device adapted to be usable with aspect B of EIP 100, it is also possible to apply different forces to the pressure points 116 and the retainers 114, respectively, for example by providing an additional cut-out or flat or ortho-planar spring (not shown in the figures) within the pressure applicator 216, so that a smaller force may be applied to the retainers 114 as compared to the force applied to the pressure points 116. In other words, even though the pressure points 116 and retainers 114 in the aspect B of EIP 100 are in close proximity, it is still possible to provide pressure applicators 216 and actuators 214 separately from one another.

As shown in FIG. 2B, the upper 210 and lower 220 portions of clamping device 200 may comprise manipulation points 211, 221 in order to enable the just described elastically bending or opening of the clamping device 200.

Figure 2C:
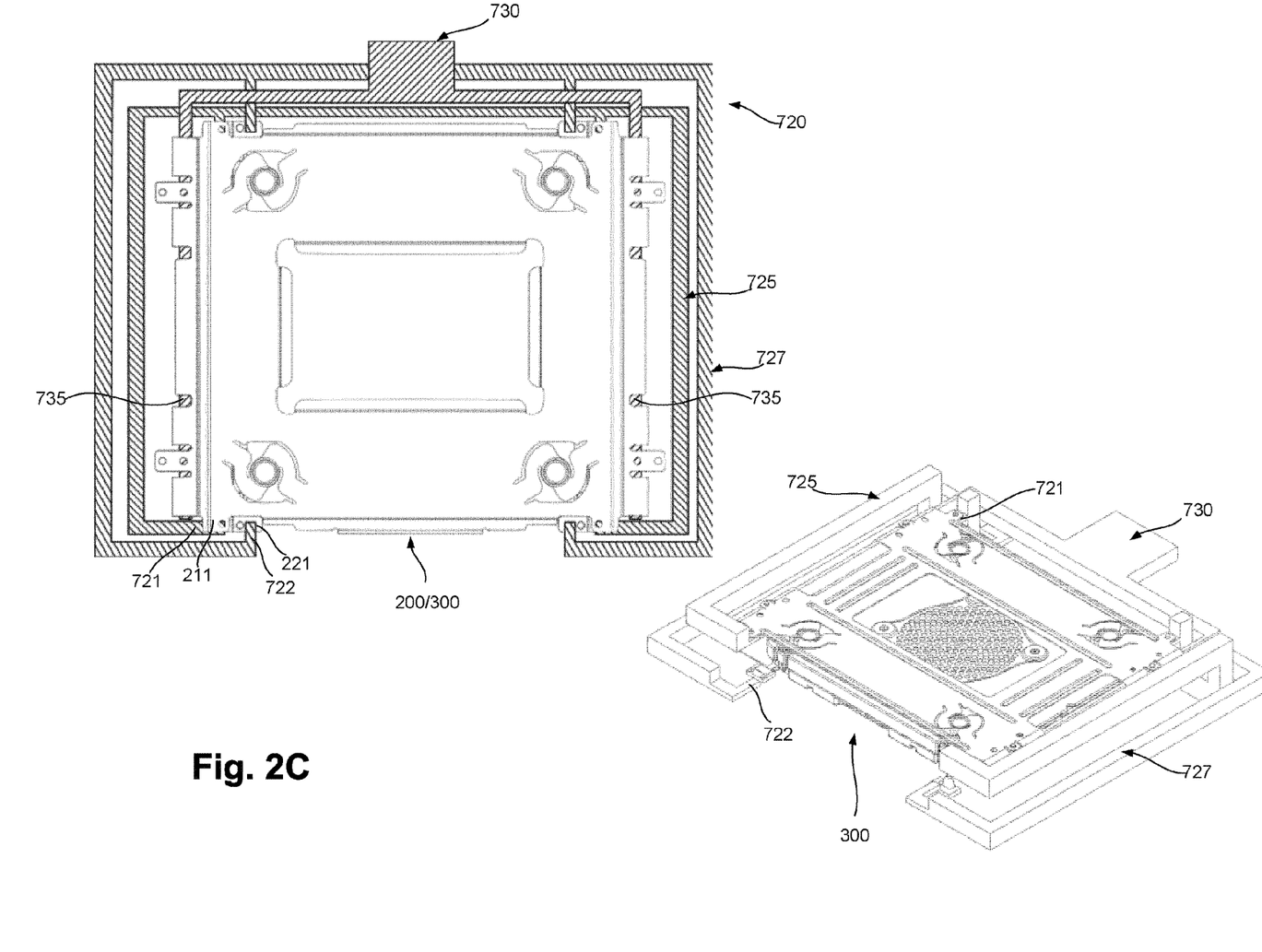
FIG. 2C schematically shows an interaction between a clamping device and an applicator according to a particularly preferred aspect of the disclosure in top and perspective views.
Figure 2D:
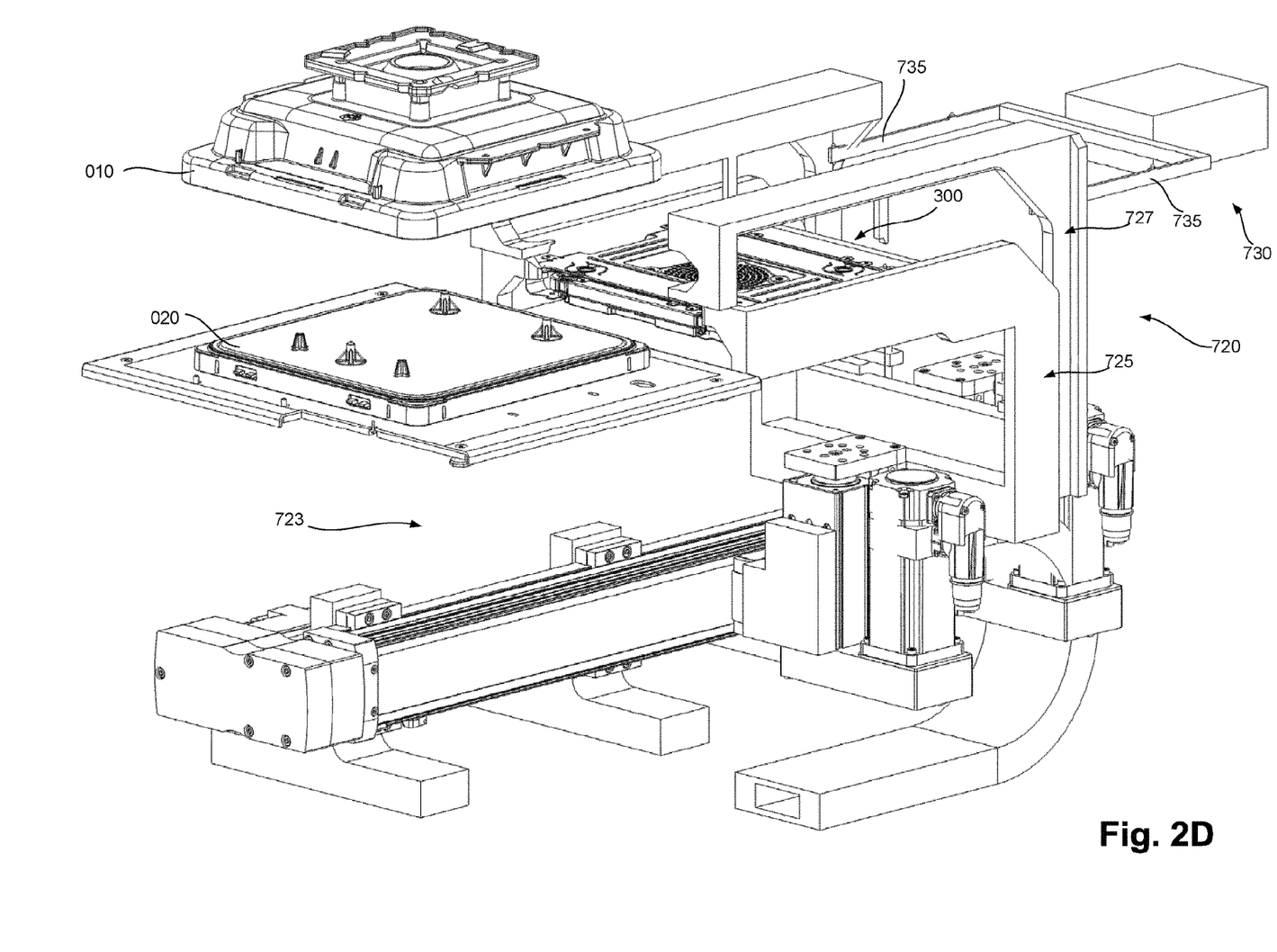
FIG. 2D shows another perspective view of a clamping device in interaction with an applicator according to an advantageous aspect of the disclosure.

In FIGS. 2C and 2D an exemplary interaction between the clamping device 200 and an applicator or assembler 720 is schematically illustrated in top and perspective views, respectively.

The applicator, in the aspect shown in FIGS. 2C and 2D, comprises an upper arm 725 with manipulation fingers 721, configured to interact with the respective manipulation points 211 of the upper portion 210 of clamping device 200, and a lower arm 727 with manipulation fingers 721, configured for an interaction with the corresponding manipulation points 221 of the lower portion 220 of clamping device 200. For example, a handler 730 may place an empty clamping device 200 onto the manipulation fingers 711 of the upper arm 725 of the applicator 720. The handler 730 may then be retracted from the clamping device 200 and the lower 727 arm may press down on the manipulation points 221 of the lower portion 220 of the clamping device 200, thereby widening the U-shaped profile 215. During pressing down, the lower arm 727 may further widen such as to follow a lateral retraction of the manipulation points 221 effected by the bending of the U-shaped profile 215, thereby avoiding abrasion on the manipulation points 221. Both of the upper 725 and lower 727 arms of the applicator may then simultaneously move the thus opened clamping device 200 in a lateral direction over an EIP 100 such that neither the clamping device 200 nor the applicator 720 contact the EIP 100 during this moving operation. Then the applicator 720 presses the clamping device 200 down onto the EIP 100 such that the ortho-planar springs act upon the pressure points 116 and the retainer 114 of the upper EIP component 110. Then the lower arm 727 of the applicator 720 moves upwards to release the lower portion 220 of the clamping device 200, thereby closing the clamping device 200 around the EIP 100. Thus a storage system 300, as also described in the following with reference to FIG. 3, is formed. The applicator can then be used to place the assembled storage system onto the handler 730, which in turn can transport the storage system to a desired location, e.g. to a storage position 742.

In FIG. 2D, additionally an opened EOP 010, 020 is depicted, from or into which an EIP 100 may be taken or placed, respectively. The EOP comprises an EOP lid 010 and an EOP base 020, which, in the depicted open state, are spaced apart from one another in the vertical direction such as to grant access to the inside of the EOP.

The applicator 720 in FIG. 2D is slidably mounted on a rail 723 allowing for lateral movement of the applicator with respect to the EOP, such that the applicator may attach the clamping device 200 onto an EIP standing on the EOP base 020 and then remove the so formed storage system 300 from the EOP base 020. This slidable arrangement may also be present in other aspects discussed herein, although not explicitly shown or discussed.

Opening a storage system 300 may be performed essentially by reversing the order of the just described steps using the same hardware.

In FIG. 3 a storage system 300 comprising an EIP 100 and a one-piece clamping device 200 with upper 210 and lower 220 portions is shown in an assembled state. The lower portion 220 is not entirely visible in FIG. 3 as it is covered by the EIP 100.

As discussed above, the immobilization force applied to the reticle through the retainers 114 is preferably smaller than the one applied to the EIP components 110, 120 through the pressing points 116. For example, the immobilization force applied to the retainers 114 collectively or to each individual retainer 114 may be selected from the range of 1 N to 100 N, preferably from the range of 5 N to 50 N, and may, for example, amount to about 20 N±5 N, e.g. 17 N. This force is preferably equally distributed across all of the provided actuators 214, in a similar manner as described with reference to the pressure applicators 216.

It is to be understood that, in comparison with an upper surface of EIP 100, the one-piece clamping device 200 covers less of a lower surface of EIP 100, since it leaves substantially the whole of the lower component 120 of EIP 100 uncovered. For example, when attached to EIP 100, clamping device 200 leaves at least 50%, 60%, 70%, 80% or 90% of EIP 100 uncovered. In some aspects, clamping device 200 leaves at least the orifice(s) 112 of EIP 100 uncovered, so that fluid access from the atmosphere surrounding the clamping device 200 towards the orifice(s) 112 is substantially unhindered.

As can be inferred from FIG. 3, the clamping device 200 is designed such that in use it extends substantially adjacently to the surface of the EIP. Thus, the storage system 300 takes up essentially the same volume as the EIP 100 on its own. For example, the envelope volume of the storage system 300 may amount to less than 130%, 120%, 110% or 105% of the envelope volume of the EIP 100 alone.

Figure 4A:
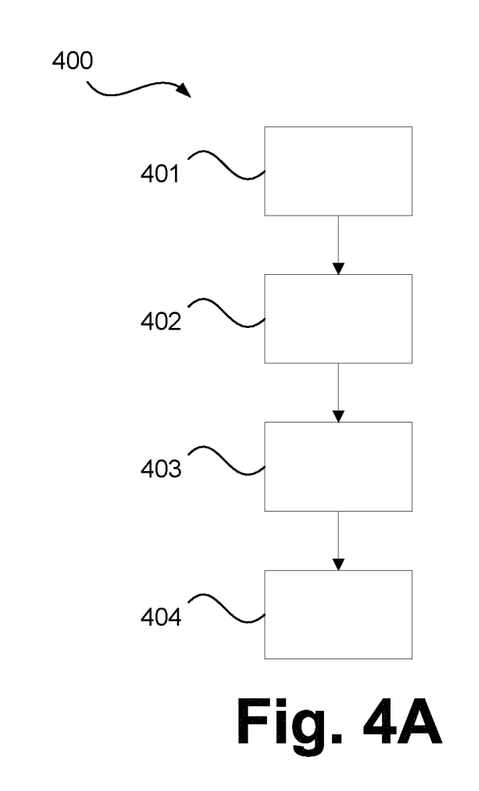
FIGS. 4A and 4B show flow charts representing preferred aspects of an operating method for an EUV reticle stocker according to the disclosure.
Figure 5:
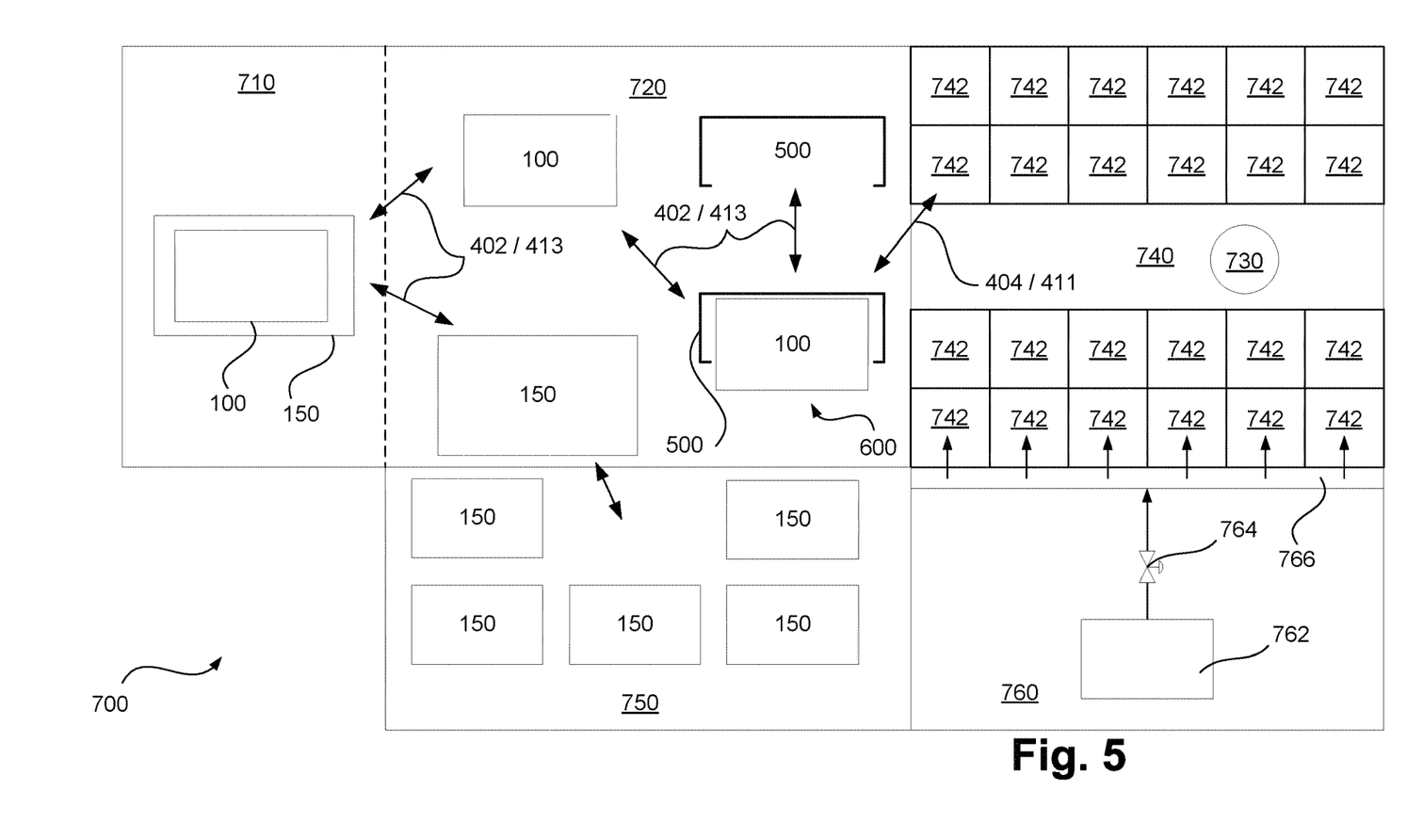
FIG. 5 schematically shows an advantageous aspect of a reticle stocker according to the disclosure.

In FIG. 4A, a preferred method of operating a reticle stocker 700 for storing reticles is illustrated in a flow diagram and collectively referred to with reference numeral 400. A corresponding reticle stocker is schematically depicted in FIG. 5.

The method will be described in the following with regard to a clamping device 200 as discussed in relation to FIGS. 2 and 2A.

In step 401, a double pod comprising an EUV outer pod (EOP) 150 and an EIP 100 contained within the EOP 150 is received from outside the stocker 700. The double pod is accepted at an outwardly facing side of an entrance terminal comprising an airlock 710 and passed through the airlock 710 to an inwardly facing side of the entrance terminal. During passing through the airlock 710, the inner volume of the airlock 710 is decontaminated, thereby ensuring that the atmosphere inside the reticle stocker 700 is not adversely affected by the receiving of the double pod.

Decontaminating the airlock 710 may comprise evacuating the airlock 710, flushing it with a fluid such as a gas, particularly an inert gas, and/or purging it with a fluid, especially an inert gas.

In step 402, the double pod is opened. Opening the double pod in this example comprises unlocking the EOP 150, removing the EOP 150 from its position surrounding the EIP 100 and moving the EOP 150 to an EOP buffer stock 750, where it may be stored until it is needed again. When the EOP 150 is removed from the EIP 100, the pressure points 116 and the retainers 114 are no longer acted upon. Therefore, at that time, the EIP components 110, 120 and the reticle contained therein are no longer immobilized relative to one another.

In step 403, a clamping device 200 is attached to the EIP 100, for example in a way as discussed in connection with FIG. 2C. Thereby, a storage system 300 as shown in FIG. 3 is provided. Attaching the clamping device 200 may particularly be effected by bending the lower portion 220 of the clamping device 200 away from the upper portion 210 of the clamping device 200, widening the U-shaped profile 215. The clamping device 200 is then moved onto the EIP 100. Then the lower portion 220 is released into the closed position, such that the lower portion presses against the lower component 120 of EIP 100 and the upper portion 210 presses against the upper component 110 of EIP 100, both in a direction perpendicular to the main plane of extension ("normal direction") of the respective portion 210, 220. Preferably, step 403 is carried out in a manner such that essentially only normal forces are applied to the EIP 100 and torsional and lateral forces are avoided. Once the clamping device 200 is mounted to the EIP 100, the immobilization function effected by the EOP 150 before opening the double pod is effectively reinstated or emulated by the clamping device 200. The forces applied to the EIP and/or reticle therein all stem from the elastic deformation of the clamping device material, especially from elastic energy stored within the U-shaped profiles 215. The flat springs 214/216 are used to distribute the forces as desired.

In step 404 the storage system 300 is moved to a storage position within the reticle stocker. Advantageously, a handler 730 for moving the storage system 300 to the respective storage position comprises a two pronged fork, wherein the two prongs 735 are spaced relative to one another such that an EIP 100 loosely fits between them. In such an aspect, the fork may be pushed into the storage system 300 in such a way that each prong comes to rest between the EIP 100 and a portion of the clamping device 200 connecting the upper portion 210 and the lower portion 220 (i.e. the vertical portion of the U-shaped profile 215) without coming into contact with the EIP 100. Moving the storage system 300 may thereby be effected without direct contact between the handler and the EIP 100, again reducing particle generation probability.

All of the steps, especially steps 402 and 403, are carried out in such a way that the reticle contained with the EIP 100 is not moved with respect to the EIP 100 in order to prevent friction induced particle generation, as described above.

Figure 4B:
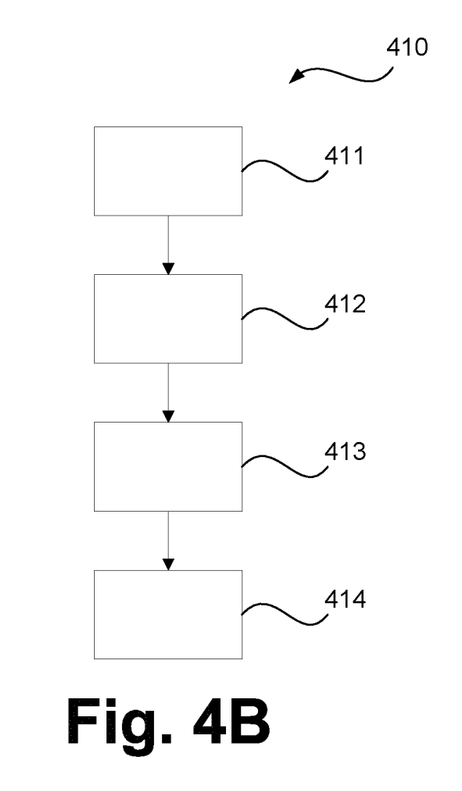

In FIG. 4B, a preferred method of operating a reticle stocker for retrieving reticles is illustrated in a flow diagram and collectively referred to with reference numeral 410.

In step 411, a storage system 300 is removed from its storage position. This step 411 may be performed in a similar way as step 404 described in connection with FIG. 4A, above.

In step 412, the clamping device 200 is removed from the EIP 100 to disassemble the storage system 300. To that end, the upper and lower portions 210, 220 of clamping element 200 are bent away from one another and collectively lifted off or retracted from the EIP 100, thereby releasing the pressure points 116 and the retainers 114. At that point, the immobilization of the reticle within the EIP 100 is no longer effective.

Steps 403 and 412 can be carried out without moving the EIP 100 at all. This can be achieved by leaving the EIP 100 on the lower component of the EOP 150 when attaching the clamping device 200 to the EIP 100 or placing it on the lower component of EOP 150 before detaching the clamping device 200, respectively. This is particularly favourable because it effectively prevents relative movement of the EIP components 110, 120 and the reticle, respectively.

In step 413, an EOP 150 is retrieved from the EOP buffer stock 750 and assembled around the EIP 100 to provide a double pod. When the double pod is fully assembled, the immobilization function effected by the clamping device 200 during the time of storage is provided by the EOP.

In step 414, the double pod formed in step 413 is delivered to outside the stocker 700. This may include passing the double pod through the airlock 710 mentioned above to the outwardly facing side of the entrance terminal. The airlock 710 can be purged or flushed during the passage of the double pod so as to prevent contaminants from entering the entrance terminal.

As shown in FIG. 5, the reticle stocker 700 comprises the already mentioned airlock 710, an assembler 720, which is configured to perform the steps 402, 403, 412 and 413 of the above described methods 400, 410, the EOP buffer stock 750, in which a number of EOPs 150 can be stored, and a storage unit 740 in which storage systems 300 can be stored in a number of storage positions 742. A handler 730 is provided with the stocker 700 for moving the storage systems 300 to and from their respective storage positions 742. Particularly, this handler 730 comprises a two pronged fork 735 configured to be pushed into a storage system 300 without mechanical contact with the EIP 100, as described above. The assembler 720 may particularly comprise upper 721 and lower 722 applicator arms, as depicted in FIG. 2C.

It is to be noted that the number of storage positions 742 can substantially exceed the number of EOPs 150 storable in the EOP buffer stock 750. As described above, only reticles which are needed outside the stocker 700 require an EOP 150. Therefore, a (small) number of EOPs 150 are stored in the EOP buffer stock 750, so that a double pod can be assembled on request for a reticle. However, since typically all the reticles are never required at the same time, there is no need to store an EOP 150 for each reticle stored within the storage unit 740.

The stocker 700 further comprises a purge system 760, configured to provide a stream of purge gas to each of the storage positions or compartments 742. For example, the purge system 760 may comprise a purge gas supply unit 762, such as a tank or one or more gas cylinders, a pressure regulator 764, a manifold configured to distribute the purge gas to different regions of the storage unit, and an interface 766 configured to provide the purge gas from the manifold to each individual storage position or compartment 742. This interface may be provided in the form of one or more diffuser plates, for example a perforated metal sheet or a plate comprising porous material, e.g. a glass frit or porous sintered metal. Purge gas flow rates may be chosen from a range between 0.2 to 1 L/min/storage position and/or from a range between 1 and 20 L/min/storage position, particularly between 2 and 10 L/min/storage position, according to desired cleanliness levels. In some aspects, the flow rates may be chosen individually different for certain storage positions in comparison to other storage positions, for example, in order to reflect different required cleanliness levels for different stored reticles or depending upon a mode of operation. Thus, for example, storage positions which have been filled recently may be purged with higher purge rates as compared to storage positions in which no change has occurred for a predetermined amount of time. Another example may be a higher purge rate for storage positions which are about to be emptied, such that the risk for particles intruding into the storage position at the time of removal of a storage system is reduced.

Typically, storage positions or compartments 742 are arranged in a stacked manner one above the other. Access to each storage position or compartment 742 for storing and retrieving EIPs 100 therein or therefrom, respectively, is typically granted via a front side of each storage position or compartment 742. The interface 766 for providing purge gas to each storage position or compartment 742 individually may therefore be arranged on a rear side or on one of the side surfaces of each storage position or compartment 742. In some aspects, an exhaust may be provided, particularly opposite of the respective interface 766 with respect to each individual storage position or compartment 742, the exhaust being configured to collect and withdraw purge gas after its passage through the respective storage position or compartment 742 so as to prevent the purge gas from flowing into a different, for example neighbouring, storage position or compartment 742 after passage through a first storage position or compartment 742. This substantially minimizes cross contamination between individual EIPs 100. In alternative aspects, the exhaust can also be arranged such that the purge gas is withdrawn via the front side of the storage positions or compartments 742. This obviates the need for providing such exhaust for each individual storage position or compartment 742 and, therefore, is less costly. In such aspects, it is advantageous that the interface 766 for providing the purge gas be at the rear side of the storage positions or compartments 742 and that a pressure in front of the front side be lower than a pressure within the storage positions or compartments 742 so as to effectively prevent reverse flow of purge gas into the storage positions or compartments 742.

The method may, therefore, comprise a step of providing a purge gas to the storage unit 740, particularly comprising withdrawing gas from the gas supply unit 762, regulating gas pressure to a desired pressure level, e.g. 1-5 bar absolute, and leading the gas to each individual storage position or compartment 742. Also, a step of withdrawing used purge gas from the storage positions or compartments 742 may be carried out. This may particularly comprise operating a pump, compressor, blower or the like to provide a pressure gradient pulling or sucking the purge gas to exit the storage positions or compartments 742 such that cross contamination is prevented.

In FIG. 2A, the clamping device 200 is additionally provided with a logging element 218 (schematically shown) comprising an identification device, such as an RFID device, and one or more sensors. The RFID device 218 is an information carrying element which is provided with an identification number so that each clamping device 200 is distinguishable from other clamping devices 200 by reading the RFID device 218. It is to be understood that, although the logging element 218 is only shown in the aspect depicted in FIG. 2A, it is also advantageous to provide such a logging element 218 with any other aspect of clamping device 200.

The one or more sensors included in the logging element 218 are configured to detect or measure, for example, a temperature, a composition (e.g. humidity) of an atmosphere surrounding the clamping device 200, a pressure and/or an acceleration acting on the clamping device 200. The logging element 218 in this example is further configured to store readings of the one or more sensors and/or to make these readings available for further processing.

In the case of clamping devices 200 being equipped with an RFID device 218, for example, the method 400 can comprise providing an association of a reticle stored in combination with a certain clamping device 200 with an identification number provided with the RFID device 218 of the used clamping device 200. This association can be stored, for example, in a central memory of the reticle stocker and/or within a central computing device of the production facility. This provides the advantage that a reticle is identifiable by the clamping device 200, used for its storage and can therefore be identified while still being safely contained within the respective EIP 100.

The method may further comprise collecting data from the one or more sensors and using this data, for example to assess if further action, e.g. an inspection of a retrieved reticle, is necessary.

Advantageously, the method 410 then uses this RFID device 218 of the clamping device 200 in order to retrieve the reticle associated with the clamping device 200. Thereby, a verification mechanism can be realised. For example, it is possible, that a storage position 742 of a given reticle within the stocker 700 is used for identifying a reticle to be retrieved from the stocker 700. When retrieving the reticle from that storage position 742, the RFID device 218 of the clamping device 200 can be read and the association of the identification number of the clamping device 200 with the stored reticle can be checked, in order to verify, that the correct reticle is being retrieved. If the identity of the reticle stored at the specific storage location and the reticle associated with the clamping device 200 differ, an identification procedure is triggered and a warning signal can be generated, so that the production does not use the reticle before its identity has been verified. This provides the advantage of a higher overall reliability of the reticle identification.

Another advantage of this association of reticles with the respective clamping device 200 is that the reticles are still identifiable even in the event that they have been removed randomly from their respective storage position. This may, for example, occur during an earthquake or a similar uncontrollable situation. In conventional methods and systems, the reticles might have to be removed from their respective EIPs for identification or the conventional storage system might even be destroyed in such situations. The presently disclosed disclosure therefore provides a safer storage environment for EUV reticles with improved traceability.

What is claimed is:

1. A clamping device for an EUV inner pod (EIP), the EIP comprising two or more components for containing an EUV reticle, wherein the clamping device comprises a single one-piece clamping element configured to:
    provide the functions of immobilizing the two or more components of the EIP relative to one another and immobilizing the reticle therein; and
    only partially cover the EIP.

2. The clamping device according to claim 1, further configured to act upon one or more retainers of the EIP, the retainer(s) being configured to immobilize the reticle therein, when acted upon from outside the EIP, to immobilize the reticle within the EIP.

3. The clamping device according to claim 1, comprising at least 75%, 80%, 90%, 95% or 99% of metallic materials with respect to its mass and/or volume.

4. The clamping device according to claim 1, comprising an upper portion and at least one U-shaped profile integrally formed at the edge of the upper portion biased towards a closed position and configured to be elastically bent into an open position; wherein the clamping device is configured to be attachable to an EIP, when the U-shaped profile is in the open position and to immobilize the EIP components and the reticle relative to one another, when the U-shaped profile is in the closed position.

5. The clamping device according to claim 4, comprising two U-shaped profiles, arranged on opposite edges of the upper portion.

6. The clamping device according to claim 1, comprising actuators configured to act upon the retainer(s), when the clamping device is attached to the EIP.

7. The clamping device according to claim 1 having an envelope volume of less than 130%, 120%, 110%, 105% or less than 100% of an envelope volume of an EIP to which the clamping device is attachable.

8. The clamping device according to claim 1 further comprising a logging element comprising one or more components including:
    an information carrying element configured for identification of the clamping device, and/or
    a temperature sensor, and/or
    a humidity sensor and/or,
    a pressure sensor and/or,
    a concentration sensor, configured to detect or measure a concentration of one or more chemical substances in an atmosphere surrounding the clamping device, and/or
    an acceleration sensor,
    wherein the logging element is configured to store and/or make available information generated using the one or more components of the logging element.

9. A storage system comprising a clamping device according to claim 1 and an EUV inner pod (EIP), wherein the EIP:
    is configured to accommodate an EUV reticle; and
    comprises two or more components and one or more retainers configured to immobilize the reticle when acted upon from outside the EIP; and
    wherein the clamping device is attachable to the EIP to immobilize the two or more components relative to one another and act upon the retainer(s).

10. The storage system according to claim 9 having an envelope volume of less than 130%, 120%, 110% or 105% of an envelope volume of the EIP.

11. A method of operating an EUV reticle stocker, comprising storing EUV reticles in the reticle stocker and retrieving reticles from the reticle stocker, wherein
the reticle is contained within an EIP comprising two or more components,
the storing comprises moving the EIP containing a reticle to a storage position within the EUV reticle stocker; and
the retrieving comprises removing an EIP containing a reticle from its storage position; and wherein
the EIP components and the reticle are immobilized relative to one another when moved to or from the storage position and when in the storage position, by a clamping device not covering the EIP completely; the method further comprising
supplying a purge gas to each storage position containing an EIP.

12. The method according to claim 11, wherein the storing, before the step of moving to a storage position, further comprises the steps of:
receiving, from outside the stocker, a double pod comprising an EUV outer pod (EOP) and an EIP containing an EUV reticle, wherein the EIP is entirely contained within the EOP;
opening the EOP; and
attaching a clamping device to the EIP to immobilize EIP components relative to one another and to act upon one or more retainers comprised in the EIP to immobilize the reticle relative to the EIP to provide the storage system.

13. The method according to claim 11, wherein receiving a double pod comprises:
accepting the double pod at an outwardly facing side of an entrance terminal comprising an airlock,
opening a first shutter of the airlock,
moving the double pod into the airlock,
closing the first shutter,
decontaminating an inner volume of the airlock,
opening a second shutter of the airlock,
moving the double pod through the second shutter to an inwardly facing side of the entrance terminal, and
closing the second shutter.

14. The method according to claim 11, wherein opening the EOP comprises:
unlocking the EOP,
removing the EOP from around the EIP, and
storing the EOP in an EOP buffer stock.

15. The method according to claim 14, wherein the EOP buffer stock is arranged as an integral component of the stocker or wherein the EOP buffer stock is arranged separated and/or spaced from the stocker.

16. The method according to claim 11, wherein the retrieving after the step of removing from the storage position further comprises the steps of:
detaching the clamping device from the EIP;
assembling n EOP around the EIP to immobilize the EIP components and the reticle contained within the EIP relative to one another, forming a double pod; and
delivering the double pod to outside the stocker.

17. A stocker for storing at least one EUV reticle, wherein each of the at least one reticle is stored in one respective EUV inner pod (EIP), wherein the EIP comprises two or more EIP components which are immobilized relative to one another by a clamping device not covering the EIP completely, wherein the EIP comprises one or more retainers configured to immobilize the reticle stored inside the EIP relative to the EIP, when acted upon from outside the EIP, wherein the clamping device acts upon the retainer(s) to immobilize the reticle stored within the EIP, the stocker comprising:
a loading port comprising an airlock and an assembler;
a storage unit configured to store in respective storage positions EIPs each immobilized by one clamping device and each containing one reticle;
a handler configured to move the clamped EIP containing the reticle to and from a respective storage position within the storage unit of the stocker; and
a purge gas supply unit configured to supply a purge gas to the storage unit
wherein:
the airlock is configured to receive a double pod comprising an EUV outer pod (EOP) and an EIP containing a reticle from outside the stocker, wherein the EOP acts upon the retainer(s); and
the assembler is configured to open the EOP without causing movement of EIP components and the reticle relative to one another; to attach said clamping device to and remove the clamping device from said EIP without causing movement of the EIP components and the reticle relative to one another; and to assemble an EOP around the unclamped EIP.

18. The stocker according to claim 17, wherein the handler comprises a two-pronged fork configured to be pushed into a storage system according to claim 9 without mechanically contacting the EIP.

19. The stocker according to claim 17, wherein the purge gas supply unit is configured to supply a purge gas, particularly in an amount corresponding to a flow rate in the range of 0.2 L/min/reticle to 1 L/min/reticle and/or corresponding to an amount in the range of 1 L/min/reticle to 20 L/min/reticle, particularly in the range of 2 L/min/reticle to 10 L/min/reticle.

20. The stocker according to claim 17, further comprising an EOP buffer stock, configured to store a number of EOPs in a controlled atmosphere, particularly provided by the purge gas supply unit, with an EOP handler configured to place an EOP into and retrieve an EOP from the EOP buffer stock.

21. A stocker system comprising a stocker according to claim 17 and an EOP buffer stock, configured to store a number of EOPs in a controlled atmosphere, particularly provided by the purge gas supply unit, with an EOP handler, configured to place an EOP into and retrieve an EOP from the EOP buffer stock, wherein the EOP buffer stock is arranged separated and/or spaced from the stocker.

* * * * *